United States Patent
Ferguson

(10) Patent No.: US 6,976,045 B2
(45) Date of Patent: *Dec. 13, 2005

(54) VARIABLE SAMPLE RATE RECURSIVE DIGITAL FILTER

(75) Inventor: Kevin M. Ferguson, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 850 days.

This patent is subject to a terminal disclaimer.

(21) Appl. No.: 09/925,546

(22) Filed: Aug. 8, 2001

(65) Prior Publication Data

US 2003/0031281 A1 Feb. 13, 2003

(51) Int. Cl.[7] .............................................. G06F 17/10
(52) U.S. Cl. ....................................... 708/322; 708/320
(58) Field of Search ................................ 708/300, 313, 708/320, 322, 323

(56) References Cited

U.S. PATENT DOCUMENTS

| 4,797,845 A | | 1/1989 | Stikvoort | |
|---|---|---|---|---|
| 5,928,313 A | * | 7/1999 | Thompson | 708/313 |
| 6,134,570 A | * | 10/2000 | Camagna et al. | 708/313 |
| 6,201,832 B1 | * | 3/2001 | Choi | 375/233 |
| 6,531,970 B2 | * | 3/2003 | McLaughlin et al. | 341/61 |
| 6,704,358 B1 | * | 3/2004 | Li et al. | 375/240.02 |
| 2001/0025290 A1 | | 9/2001 | Schollhorn | |

FOREIGN PATENT DOCUMENTS

WO     WO 00/02311     1/2000

* cited by examiner

Primary Examiner—Chuong Dinh Ngo
(74) Attorney, Agent, or Firm—Francis I. Gray

(57) ABSTRACT

A variable sample rate recursive digital filter is an adaptive digital filter where its coefficients are recalculated for each sample rate being processed in such a way as to maintain a constant frequency rate for all sample rates. An equivalent resampling is done by taking the ratio of the bilinear transforms at the respective sample rates. From an initial or calibrated sample rate and a corresponding initial filter coefficient, a new filter coefficient for a new sample rate is obtained by multiplying the initial filter coefficient by a constant or coefficient factor that is a function of the initial filter coefficient and a ratio of the initial and new sample rates:

$$zFactor(z,R) := (1/z)\{(z(1+R)+(1-R))/(z(1-R)+(1+R))\}$$

The resulting new filter coefficient provides the adaptive digital filter with a constant frequency response when compared to the initial sample rate frequency response.

8 Claims, 2 Drawing Sheets

VARIABLE SAMPLE RATE RECURSIVE DIGITAL FILTER

BACKGROUND OF THE INVENTION

The present invention relates to digital filtering, and more particularly to a variable sample rate recursive digital filter that maintains a constant frequency response over a range of sample rates.

A problem that is common to several signal processing applications, such as sampling rate conversion, jitter/wander compensation and/or measurement, picture quality measurement and the like, is trying to maintain a constant frequency response over a range of sample rates. In picture quality measurement based on human vision models where test and reference video sequences are viewed with different formats, displays (frame rates, spatial resolutions) and viewing distances (different spatial sample rates within the field of view for the human eye), it is important to maintain both efficiency and accuracy. Maintaining the spatial and temporal frequency response of an adaptive filter, such as that described in co-pending U.S. patent application Ser. No. 09/858,775 filed May 16, 2001, allows one to simulate the perceptual difference between viewing a video sequence close to a display (i.e., two screen heights) and far away (i.e., 10 screen heights) without the need for re-sampling, for example.

Prior methods require either re-sampling or re-calibration of the human vision model. Calibration may be very time consuming, so it is not desirable to calibrate for every distinct viewing distance. Re-sampling involves resampling the data twice, once for the input to the human vision model and then for the intermediate human vision model image just prior to calculations involving both reference and test video (differencing). This requires extra processing and introduces interpolation inaccuracies.

What is desired is a variable sample rate recursive digital filter that maintains a constant frequency response over a range of sample rates without requiring re-sampling or re-calibration for each new sample rate.

BRIEF SUMMARY OF THE INVENTION

Accordingly the present invention provides a variable sample rate recursive digital filter that changes filter coefficients of an adaptive digital filter according to respective equivalent sample rates. The adaptive digital filter is calibrated initially for a specific sample rate which determines specific filter coefficients to be used. When the sample rate is changed, a ratio is determined between the calibrated or initial sample rate and the new sample rate and from the ratio a coefficient factor is calculated. The coefficient factor is used to modify the initial filter coefficients for the calibrated sample rate to produce new coefficients for the new sample rate. The new coefficients are applied to the adaptive digital filter to provide the desired signal processing without requiring re-sampling or re-calibration and without changing the frequency response.

The objects, advantages and other novel features of the present invention are apparent from the following detailed description when read in conjunction with the appended claims and attached drawing figure.

DETAILED DESCRIPTION OF THE INVENTION

Figure 1:
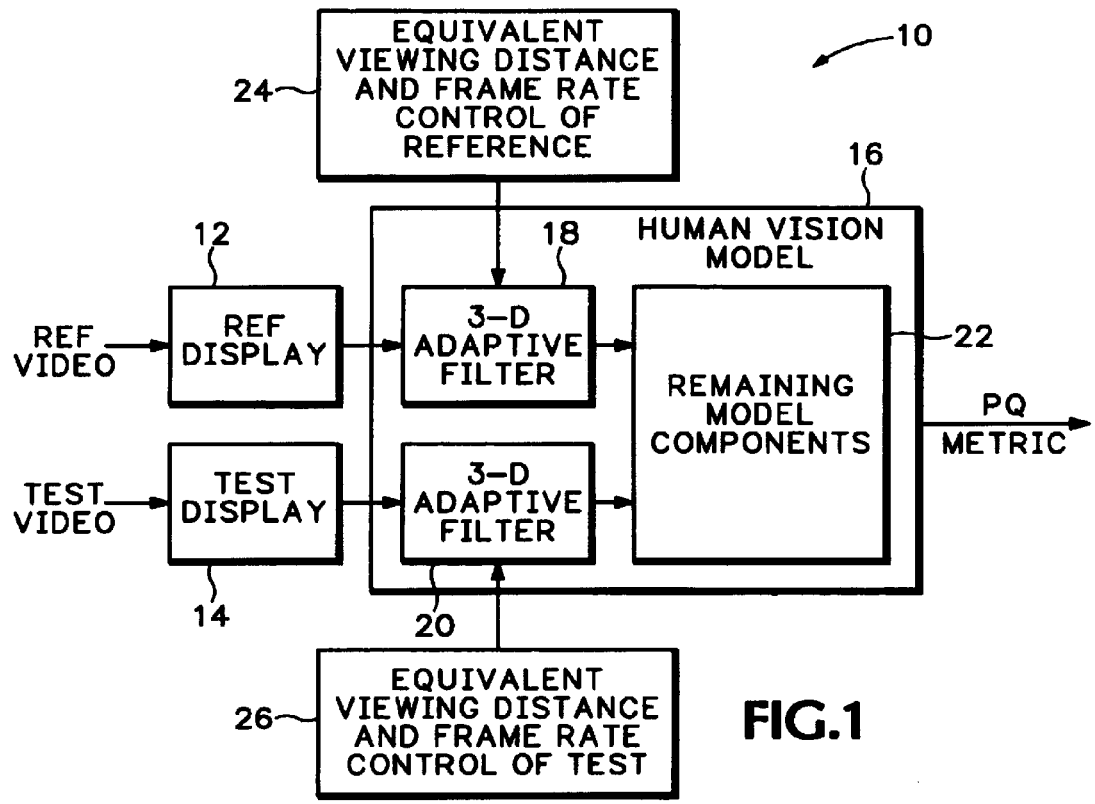
FIG. 1 is a block diagram view of a human vision model based picture quality metric apparatus incorporating variable sample rate recursive digital filters according to the present invention.

Referring now to FIG. 1 a human vision model based picture quality metric apparatus 10, shown as an example of a signal processing apparatus using variable sample rate recursive digital filters, has as inputs a reference video sequence and a test (degraded) video sequence. The video sequences are stored and displayed on respective display devices 12, 14, and processed by a human vision model 16. Each channel, reference and test, is processed initially by adaptive digital filters 18, 20, as described in the above-referenced pending U.S. Patent Application, before being processed by the remaining model components 22 to provide a picture quality metric output. Each digital filter 18, 20 has equivalent viewing distance or spatial sample rate and frame rate or temporal sample rate controllers 24, 26 that provide variable coefficients to the digital filters to independently tune them to particular viewing distance and/or frame sample rates.

The control signals, or new coefficients, for the digital filters 18, 20 to give the equivalent response of re-sampling both the input and output are derived from taking the ratio of bilinear transforms at respective sample rates. Traditionally a bilinear transform B converts the filter poles in the z-domain (spatial) to the s-domain (frequency) where the sample rate changes are linear. The pole in the s-domain is multiplied by a sample rate ratio and then converted back to the z-domain.

$$B\{P_z\} \rightarrow P_s;\ B^{-1}\{P_s * R\} \rightarrow P'_z = K * P_z$$

where B is the bilinear transform, $P_z$ is the filter pole in the z-domain, $P_s$ is the transformed filter pole in the s-domain, R is the ratio of the initial and new sample rates, K is a constant or zFactor, and $P'_z$ is the new filter pole transformed back to the z-domain.

Figure 2:
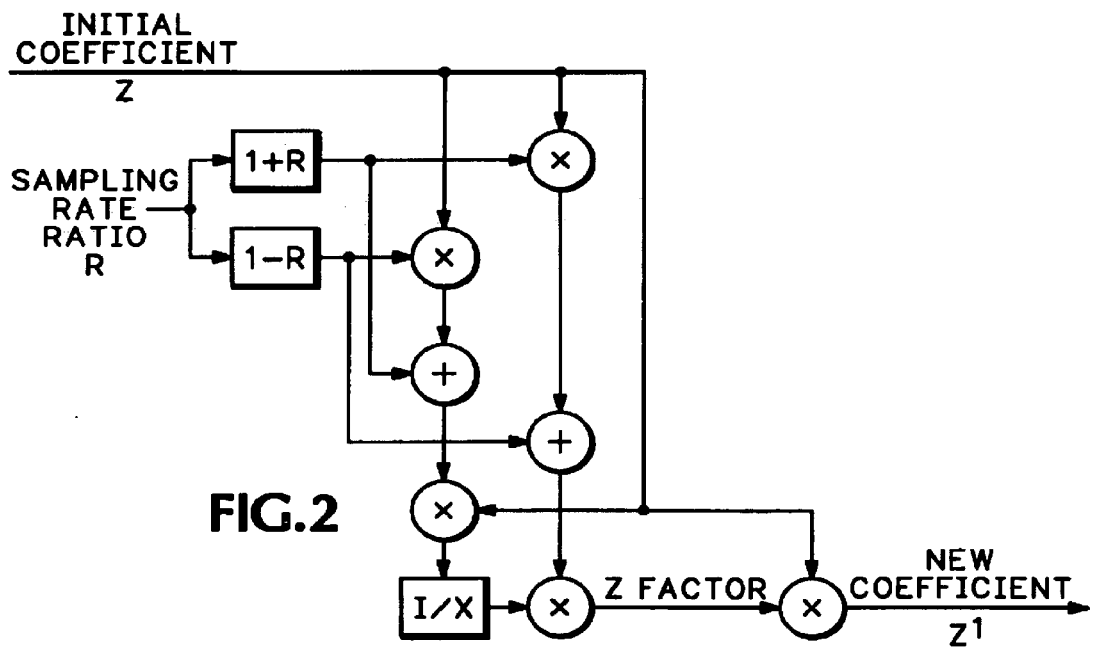
FIG. 2 is a block diagram view of a variable equivalent sample rate coefficient converter for the variable sample rate recursive digital filters according to the present invention.

Given an initial or calibrated sample rate and a corresponding filter coefficient, the new filter coefficient for the new sample rate is obtained by multiplying the initial filter coefficient by K or zFactor determined as follows:

$$zFactor(z,R) := (1/z)\{(z(1+R)+(1-R))/(z(1-R)+(1+R))\}$$

where z=initial z-domain coefficient and R=ratio of sample rates (old/new). This equation is illustrated by FIG. 2 and may be implemented in hardware or in software.

Consider a recursive, first order, difference equation for a filter of the form:

$$y_{n+1} := y_n + c(x_n - y_n); y_n = y_{n-1} + c(x_{n-1} - y_{n-1}) = (1-c)y_{n-1} + cx_{n-1}.$$

The Z-transform of the equation is:

$$H(z,c) := c/(z-1+c)$$

If DC gain is held to unity: c/(1−1+c)=1; then z=1 and H(z,c)=1 and the filter has a pole at (1−c), i.e., for c=0.3, pole=0.7.

The frequency response is given by:

$$F(c,\omega):=H(e^{-j\omega},c) \text{ and } \omega_n=\pi(n/N) \text{ where } n/N \text{ varies between 0 and 1.}$$

Figure 3:
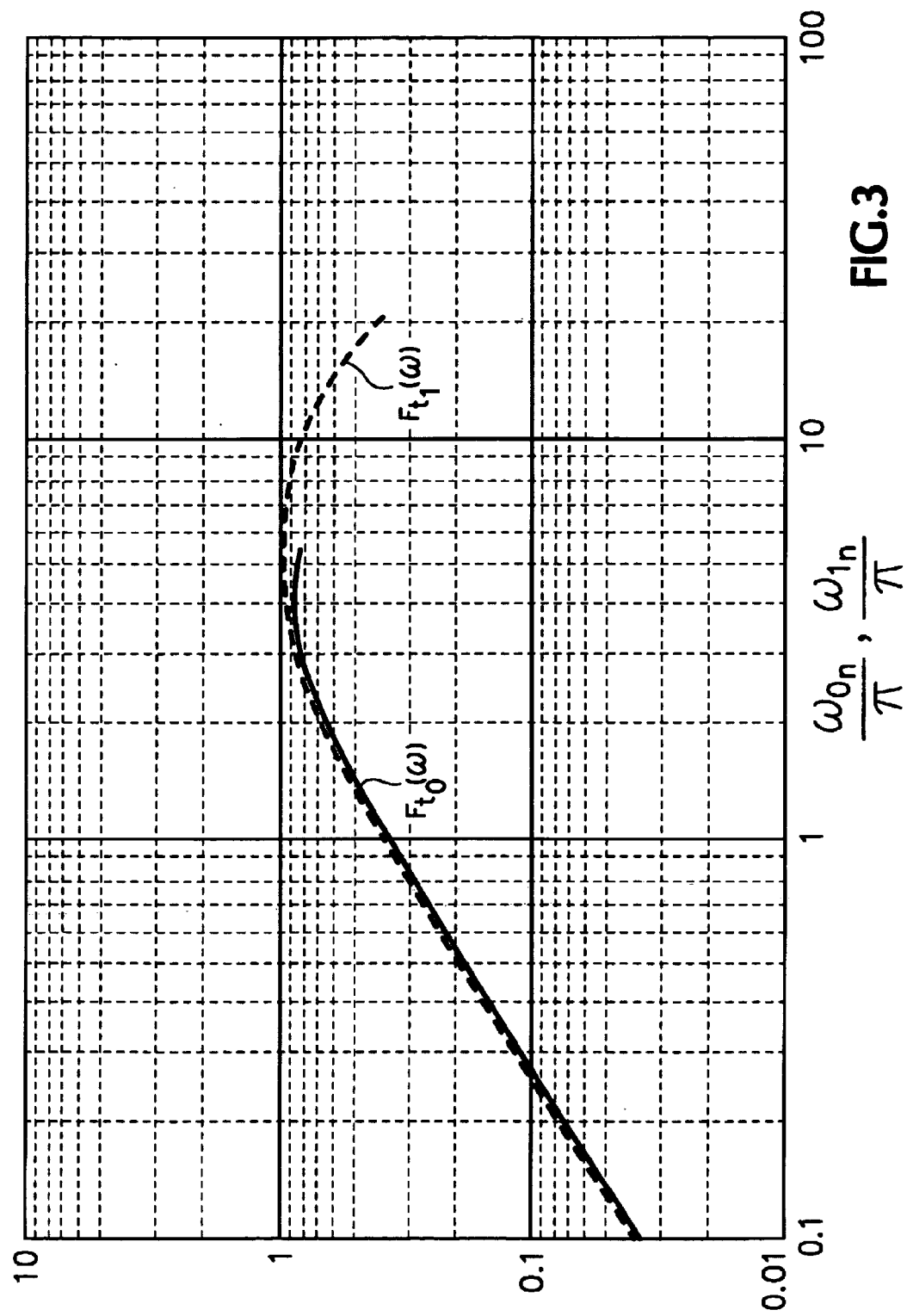
FIG. 3 is a graph diagram view illustrating the constant frequency response of the variable sample rate recursive digital filters at different sample rates according to the present invention.

The following is an example matching a filter composite frequency response after temporal resampling based on the bilinear transform. The illustrative filter is a bandpass filter generated from the difference between two lowpass filters. If the initial sample rate $T_0$ is 1/60 and the respective lowpass filter coefficients are $C_{ts0}=0.6$ and $C_{tc0}=0.48$, then when the rate changes to $T_1=1/24$ the ratio R becomes 0.4, i.e., $T_0/T_1=(1/60)/(1/24)=24/60=0.4$. Then the new coefficients become $C_{ts1}:=\text{zFactor}(C_{ts0},R)*C_{ts0}$ and $C_{tc1}:=\text{zFactor}(C_{tc0},R)*C_{tc0}$, i.e., $C_{ts1}=0.818$ and $C_{tc1}=0.754$. The new sample rate $\omega_1=\omega_0*R$. The frequency response of the bandpass filter is then given by $F_{r0}(\omega):=|F(C_{tc0},\omega)^2-F(C_{ts0},\omega))^2|$ for the initial sample rate and $F_{r1}(\omega):=|F(C_{tc1},\omega)^2-F(C_{ts1},\omega)^2|$ for the new sample rate. When scaled appropriately and plotted together as shown in FIG. 3, where the solid line is the frequency response of the composite filter at the initial sample rate and the dotted line is the frequency response of the composite filter at the new sample rate, it is apparent that using the bilinear transform provides the desired constant frequency response result for the filter.

Thus the present invention provides a variable sample rate recursive digital filter by using a bilinear transform to determine a coefficient factor as a function of an initial coefficient and a ratio of an initial sample rate and a new sample rate, the coefficient factor being used to adjust the initial coefficient for the new sample rate so that when applied to the variable sample rate recursive digital filter the frequency response at the different sample rates is constant.

What is claimed is:

1. A variable sample rate recursive digital filter comprising:
   an adaptive digital filter having as an input an initial coefficient that defines how a digital signal is processed at an initial sample rate by the adaptive digital filter; and
   means for determining as a function of the initial coefficient and a ratio between the initial sample rate and a new sample rate a new coefficient for the adaptive digital filter when the digital signal is processed at the new sample rate so that the frequency response of the adaptive digital filter is constant at both sample rates.

2. The variable sample rate recursive digital filter as recited in claim 1 wherein the determining means comprises:
   means for calculating a coefficient factor as a function of the initial coefficient and the ratio; and
   means for modifying the initial coefficient with the coefficient factor to produce the new coefficient.

3. The variable sample rate recursive digital filter as recited in claim 2 wherein the calculating means performs the equation:

$$\text{zFactor}(z,R):=(1/z)\{(z(1+R)+(1-R))/(z(1-R)+(1+R))\}$$

where zFactor(z,R) is the coefficient factor, z is the initial coefficient and R is the ratio.

4. The variable sample rate recursive digital filter as recited in claim 2 or 3 wherein the modifying means comprises means for multiplying the initial coefficient by the coefficient factor to produce the new coefficient.

5. A method of variable sample rate recursive digital filtering a digital signal comprising the steps of:
   determining an initial sample rate and a corresponding initial coefficient for an adaptive digital filter that processes the digital signal;
   determining a new coefficient as a function of the initial coefficient and a ratio between the initial sample rate and a new sample rate for processing the digital signal; and
   applying the new coefficient to the adaptive digital filter such that the adaptive digital filter has a constant frequency response at the two sample rates.

6. The method as recited in claim 5 wherein the new coefficient determining step comprises the steps of:
   calculating a coefficient factor as a function of the initial coefficient and the ratio; and
   modifying the initial coefficient with the coefficient factor to produce the new coefficient.

7. The method as recited in claim 6 wherein the calculating step comprises the steps of:
   solving the equation:

$$\text{zFactor}(z,R):=(1/z)\{(z(1+R)+(1-R))/(z(1-R)+(1+R))\}$$

where zFactor(z,R) is the coefficient factor, z is the initial coefficient and R is the ratio.

8. The method as recited in claim 6 or 7 wherein the modifying step comprises the step of multiplying the initial coefficient by the coefficient factor to produce the new coefficient.

* * * * *